(12) United States Patent
Wei et al.

(10) Patent No.: US 9,059,068 B2
(45) Date of Patent: Jun. 16, 2015

(54) PIXEL STRUCTURES OF CMOS IMAGING SENSORS AND FABRICATION METHOD THEREOF

(71) Applicants: Semiconductor Manufacturing International (Beijing) Corporation, Beijing (CN); Semiconductor Manufacturing International (Shanghai) Corporation, Shanghai (CN)

(72) Inventors: Yan Wei, Shanghai (CN); Hualong Song, Shanghai (CN); Yanchun Ma, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/283,426

(22) Filed: May 21, 2014

(65) Prior Publication Data

US 2015/0091065 A1     Apr. 2, 2015

(30) Foreign Application Priority Data

Sep. 30, 2013    (CN) .......................... 2013 1 0461748

(51) Int. Cl.
*H01L 27/148*  (2006.01)
*H01L 27/146*  (2006.01)

(52) U.S. Cl.
CPC .... *H01L 27/14806* (2013.01); *H01L 27/14687* (2013.01); *H01L 27/14875* (2013.01); *H01L 27/14881* (2013.01); *H01L 27/14887* (2013.01); *H01L 27/14831* (2013.01)

(58) Field of Classification Search
CPC ................... H01L 27/14603; H01L 27/14689; H01L 31/103; H01L 31/1804; H01L 27/1463; H01L 27/14643; H01L 31/035281; H01L 27/14875; H01L 27/14831; H01L 27/14881; H01L 27/14887; H01L 27/14687; H01L 27/14806
USPC ................... 257/227, 292, 293, 510, 231, 59; 438/98, 87, 73, 48, 221
See application file for complete search history.

(56) References Cited

U.S. PATENT DOCUMENTS 8,803,204 B1 *   8/2014   Ohta et al. ..................... 257/231
2005/0279998 A1 *   12/2005   Cole et al. ....................... 257/59

(Continued)

*Primary Examiner* — Mohammed Shamsuzzaman
(74) *Attorney, Agent, or Firm* — Anova Law Group, PLLC

(57) ABSTRACT

A method is provided for fabricating a pixel structure of a CMOS transistor. The method includes providing a semiconductor substrate doped with first type doping ions; and forming a trench in the semiconductor substrate by etching the semiconductor substrate. The method also includes forming isolation layers on side surfaces of the trench to prevent dark current from laterally transferring; and forming an epitaxial layer doped with second type doping ions with a doping type opposite to a doping type of the first type doping ions in the trench. Further, the method includes forming a pinning layer on a top surface of the epitaxial layer; and forming a gate structure on a surface of the semiconductor substrate at one side of the epitaxial layer. Further, the method also includes forming a floating diffusion region in the semiconductor substrate at one side of the gate structure far from the epitaxial layer.

10 Claims, 4 Drawing Sheets

(56) References Cited

U.S. PATENT DOCUMENTS

| | | |
|---|---|---|
| 2006/0038254 A1* | 2/2006 | Jin ................................ 257/510 |
| 2007/0026326 A1* | 2/2007 | Kim et al. .................... 430/57.3 |
| 2007/0128954 A1* | 6/2007 | Itonaga ......................... 439/852 |
| 2007/0187734 A1* | 8/2007 | Adkisson et al. ............. 257/293 |
| 2008/0283885 A1* | 11/2008 | Hynecek ....................... 257/292 |
| 2008/0299700 A1* | 12/2008 | Lan et al. ........................ 438/98 |
| 2011/0127408 A1* | 6/2011 | Yanagita et al. ........... 250/208.1 |

* cited by examiner

PIXEL STRUCTURES OF CMOS IMAGING SENSORS AND FABRICATION METHOD THEREOF

CROSS-REFERENCES TO RELATED APPLICATIONS

This application claims the priority of Chinese patent application No. 201310461748.7, filed on Sep. 30, 2013, the entirety of which is incorporated herein by reference.

FIELD OF THE INVENTION

The present invention generally relates to the field of imaging sensors and, more particularly, relates to pixel structures of CMOS imaging sensors and fabrication techniques thereof.

BACKGROUND

An imaging sensor is a device that is used to convert an optical image to electrical signals. Currently used types of imaging sensors include complementary metal-oxide-semiconductor (CMOS) imaging sensors and the semiconductor charge-coupled device (CCD) imaging sensors, etc. The benefits of CCD imaging sensors include high sensitivity and low noise, etc. However, it may be difficult to integrate CCD imaging sensors with other devices. Further, the power consumption of CCD imaging sensors may be relatively high. Comparing with CCD imaging sensors, CMOS imaging sensors have the benefits of simple fabrication process, easy integration with other devices, small size, low weight, low power consumption and low cost, etc. Currently, CMOS imaging sensors are widely used in the static digital cameras, cell phone cameras, digital video cameras, medical video instrument (such as gastroscopes, etc.), and automobile video instrument, etc.

The basic unit of a CMOS imaging sensor is referred as a pixel. The pixel includes a photodiode and three transfer transistors or four transfer transistors, which are referred as a 3T model or a 4T model, respectively. The majority of the CMOS imaging sensors in the markets are the 4T model.

FIG. 1 illustrates a 4T model CMOS imaging sensor. The CMOS imaging sensor includes four transfer transistors, a floating diffusion region FD and one photodiode PD. The four transfer transistors are a reset transistor M1, an amplify transistor M2, a select transistor M3 and a transfer transistor M4.

Before receiving the incident light, the reset transistor M1 and the transfer transistor M4 are turned on; and the amplify transistor M2 and the select transistor M3 are turned off. The floating diffusion region FD and the photodiode PD are reset. Then, all the transistors are turned off; the photodiode receives the incident light and converts the incident light to photo-induced carriers. Then, the transfer transistor M4 is turned on; and other transistors are still turned off, the photo-induced carriers are transferred from the photodiode PD to the floating diffusion region FD. Next, the amplify transistor M2 and the select transistor M3 are turned on, the photo-induced carriers are output from the floating diffusion region FD through the amplify transistor M2 and the select transistor M3. Thus, a cycle of light receiving and transferring are completed.

The transferring of the photo-reduced carriers from the photodiode PD to the floating diffusion region FD depends the potential difference between the photodiode PD and the floating diffusion region FD. When the potential difference is greater than the potential barrier between the photodiode PD and the floating diffusion region FD, the photo-induced carriers are transferred to the floating diffusion region FD.

FIG. 2 illustrates the pixel structure of an existing N-type CMOS imaging sensor. As shown in FIG. 2, the pixel structure of the N-type CMOS imaging sensor include a P-type semiconductor substrate 101 and a transfer transistor 103 formed on the P-type semiconductor substrate 101. The transfer transistor 103 includes a gate structure (not labeled) formed on the P-type semiconductor substrate 101 and a photodiode (not labeled) formed in the P-type semiconductor substrate 101 at one side of the gate structure. The photodiode includes an N-type heavily-doped region 104 formed in the P-type semiconductor substrate 101. The N-type heavily doped region 104 is configured as a photo sensitive region. The N-type heavily doped region 104 is also configured as an anode of the photodiode. The pixel structure of the N-type CMOS imaging sensor also includes an N-type floating diffusion region 150 formed in the P-type semiconductor substrate 101 at the other side of the gate structure. Further, the pixel structure of the N-type CMOS imaging sensor includes shallow trench isolation (STI) structures 102 configured to isolate adjacent active regions.

However, it may be easy for the above pixel structure of the N-type CMOS imaging sensor to generate a dark current, thus the imaging quality of the pixel structure may be affected. The disclosed device structures and methods are directed to solve one or more problems set forth above and other problems.

BRIEF SUMMARY OF THE DISCLOSURE

One aspect of the present disclosure includes a method for fabricating a pixel structure of a CMOS transistor. The method includes providing a semiconductor substrate doped with a first type doping ions; and forming a trench in the semiconductor substrate by etching the semiconductor substrate. The method also includes forming isolation layers on the side surfaces of the trench to prevent dark currents from laterally transferring; and forming an epitaxial layer doped with second type doping ions with a doping type opposite to a doping type of the first type doping ions in the trench by filling up the trench and covering a portion of a surface of the semiconductor substrate around the trench. Further, the method includes forming a pinning layer on the epitaxial layer; and forming a gate structure on a surface of the semiconductor substrate at one side of the epitaxial layer. Further, the method also includes forming a floating diffusion region in the semiconductor substrate at one side of the gate structure far from the epitaxial layer.

Another aspect of the present disclosure includes a pixel structure of a CMOS transistor. The pixel structure includes a semiconductor substrate doped with first type doping ions; and a gate structure formed on the semiconductor substrate. The pixel structure also includes an epitaxial layer doped with second type doping ions with a doping type opposite to a doping type of the first type doping ions formed in the semiconductor substrate at one side of the gate structure; and isolation layers formed between side surfaces of the epitaxial layer and the semiconductor substrate to prevent dark current from laterally transferring; Further, the pixel structure includes a floating diffusion region formed in the semiconductor substrate at the other side of the gate structure; and a pinning layer formed on the epitaxial layer.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
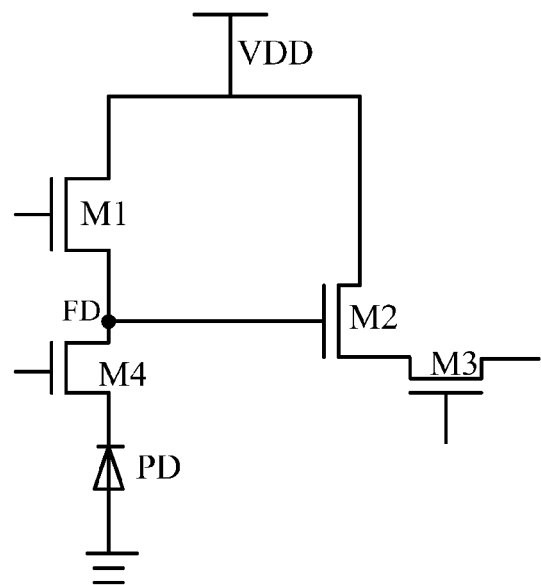
FIG. 1 illustrates a CMOS imaging sensor.
Figure 2:
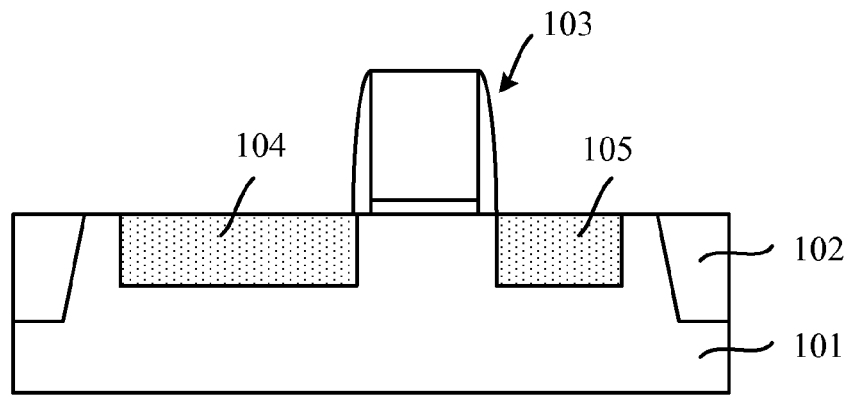
FIG. 2 illustrates a pixel structure of an N-type CMOS imaging sensor.

Referring to FIG. 2, there may be two major reasons for the CMOS imaging sensor to generate the dark current. When the shallow trench isolation structures 102 are formed, a plenty of suspending bonds may be formed at the interface between the shallow trench isolation structures 102 and the semiconductor substrate 101. The suspending bonds may form interface defects at the interface between the shallow trench isolation structures 102 and the semiconductor substrate 101; and the interface defects may absorb electrons. When the semiconductor substrate 101 is heated, a plenty of electrons caused by the heat may be generated at the interface between the shallow trench isolation structures 120 and the semiconductor substrate 101. The electrons may diffuse and/or drift in the semiconductor substrate 101, when a portion of the electrons arrives at the photo-sensitive region 104, the dark current may be generated. On the other hand, the photo-sensitive region 104 may be formed by an ion implantation process; it may be easy to generate a dark current at the interface between the photo-sensitive region 104 and the semiconductor substrate 101. The disclosed device structures and methods prevent the dark current by forming isolation layers between photo-sensitive region and the semiconductor substrate and between the photo-sensitive regions and the shallow trench isolation structures.

Figure 9:
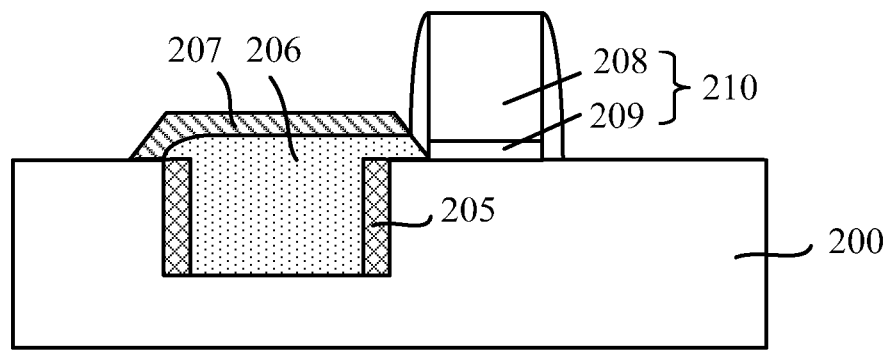
Figure 10:
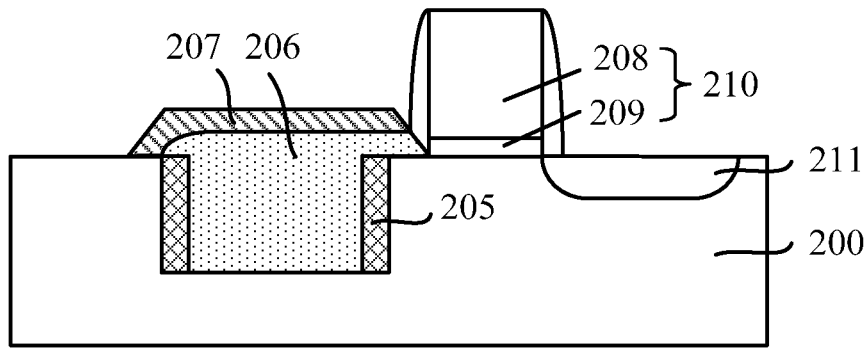
Figure 11:
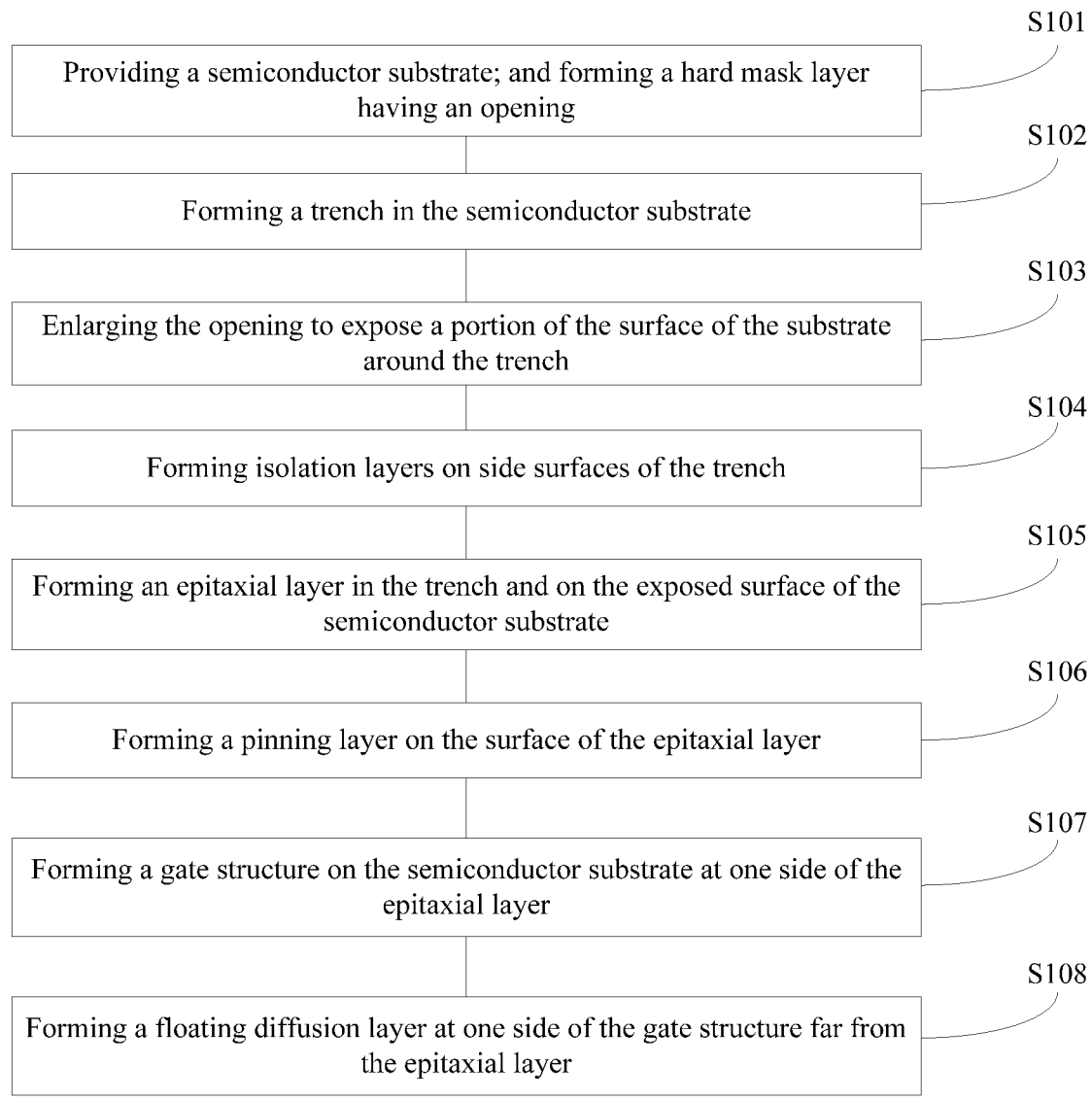
FIG. 11 illustrates an exemplary fabrication process of a pixel structure of a CMOS imaging sensor consistent with the disclosed embodiments.

FIG. 11 illustrates an exemplary fabrication process of a pixel structure of a CMOS imaging sensor; and FIGS. 3~10 illustrate exemplary semiconductor structures corresponding to various stages of the fabrication process.

Figure 3:
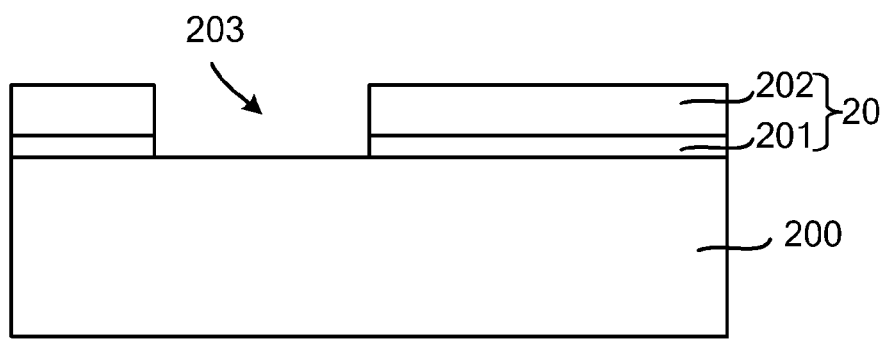
FIGS. 3~10 illustrate semiconductor structures corresponding to certain stages of an exemplary fabrication process of a pixel structure of a CMOS imaging sensor consistent with the disclosed embodiments.

As shown in FIG. 11, at the beginning of the fabrication process, a semiconductor substrate with certain structures is provided (S101). FIG. 3 illustrates a corresponding semiconductor structure.

As shown in FIG. 3, a semiconductor substrate 200 is provided. The semiconductor substrate 200 may be doped with first type doping ions. A hard mask layer 20 is formed on a top surface of the semiconductor substrate 200. The hard mask layer 20 may have an opening 203 exposing the top surface of the semiconductor substrate 200. Some other devices may be included in the substrate 200; and some other devices may be omitted.

The semiconductor substrate 200 may include any appropriate semiconductor materials, such as silicon, silicon on insulator (SOI), germanium on insulator (GOI), silicon germanium, carborundum, indium antimonide, lead telluride, indium arsenide, indium phosphide, gallium arsenidie, gallium antimonite, or alloy semiconductor, etc. The semiconductor substrate 200 provides a base for subsequent processes and structures.

The semiconductor substrate 200 may be doped with first type doping ions. The doping type of the first type doping ions may be chosen according to the conductive type of the pixel structure of the CMOS imaging sensor. Specifically, when the conductive type of the pixel structure of the CMOS imaging sensor is N-type. The semiconductor substrate 200 may be doped with P-type first doping ions. The P-type first doping ions may include one or more of boron ions, gallium ions and indium ions. Correspondingly, the subsequently formed epitaxial layer and the subsequently formed floating diffusion region may be doped with ions opposite to the conducting type of the semiconductor substrate 200. That is, the subsequently formed epitaxial layer and the subsequently formed floating diffusion region may be doped with N-type ions. The N-type ions may include one or more of phosphorous ions, arsenic ions and antimony ions, etc. Similarly, when the conductive type of the pixel structure of the CMOS imaging sensor is P-type, the semiconductor substrate 200 may be doped with N-type first doping ions; and the subsequently formed epitaxial layer and the subsequently formed floating diffusion region may be doped with P-type ions.

For illustrative purposes, the pixel structure of an N-type CMOS imaging sensor is used for the description. In one embodiment, the semiconductor substrate 200 is doped with P-type ions. The P-type ions are one or more of boron ions, gallium ions and the indium ions.

Various processes may be used to dope the semiconductor substrate 200. In one embodiment, a P-type doped epitaxial semiconductor layer may be formed on a semiconductor substrate. In certain other embodiments, the semiconductor substrate 200 may be doped by a P-type ion implantation process.

The hard mask layer 20 may be a single layer structure, or a multiple-stacked structure. The opening 203 may be formed in the hard mask layer 20. The opening 203 may expose the tope surface of the semiconductor substrate 200. The hard mask layer 20 may be used to subsequently form a trench in the semiconductor substrate 200 by etching the semiconductor substrate 200 along the opening 203.

In one embodiment, the hard mask layer 20 is a multiple-stacked structure. As shown in FIG. 3, the hard mask layer 20 includes an interface layer 201 formed on the semiconductor substrate 200 and a hard mask layer 202 formed on the interface layer 201.

The interface layer 201 may prevent a lattice mismatch caused by directly forming the hard mask layer 202 on the semiconductor substrate 200. The interface layer 201 may be made of any appropriate material, such as silicon oxide, silicon nitride, or silicon oxynitride, or silicon carbonitride, etc. In one embodiment, the interface layer 201 is made of silicon oxide. Various processes may be used to form the interface layer 201, such as a chemical vapor deposition (CVD) process, a physical vapor deposition (PVD) process, an atomic layer deposition (ALD) process, a thermal oxidation process, or a flowable chemical vapor deposition (FCVD) process, etc.

The hard mask layer 202 may be made of any appropriate material, such as silicon nitride, silicon oxynitride, amorphous carbon, silicon carbonitride, TiN, or TaN, etc. In one embodiment, the hard mask layer 202 is made of silicon nitride. Various processes may be used to form the hard mask layer 202, such as a CVD process, a PVD process, or an FCVD process, etc.

The opening 203 may be formed by an etching process, such as a dry etching process, a wet etching process, or an ion beam etching process, etc.

Figure 4:
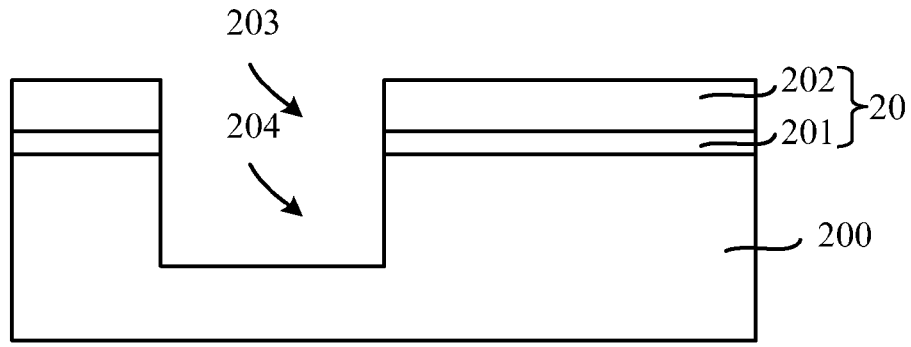

Returning to FIG. 11, after providing the semiconductor substrate 200 and forming the hard mask layer 20, a trench may be formed (S102). FIG. 4 illustrates a corresponding semiconductor structure.

As shown in FIG. 4, a trench 204 is formed in the semiconductor substrate 200. The trench 204 may be formed by etching the semiconductor substrate 200 using the hard mask layer 20 as an etching mask along the opening 203. An epitaxial layer may be subsequently formed in the trench 204; and the epitaxial layer may be configured as a portion of a photodiode.

In one embodiment, the side surface of the trench 204 may be vertical to the top surface of the semiconductor substrate 200. In certain other embodiments, the trench 204 may have an inclining sidewall. That is, the width of the trench 204 may increase from bottom to top. The inclining angle of the side surface of the trench 204 may be in a range of approximately 86°~89°.

Various processes may be used to form the trench 204, such as a dry etching process, a wet etching process, or an ion beam etching process, etc. In one embodiment, a dry etching process is used to form the trench 204. The etching gas of the dry etching process may include HBr, or $Cl_2$, etc.

In certain other embodiments, the trench 204 may be a shallow trench isolation (STI) structure.

Figure 5:
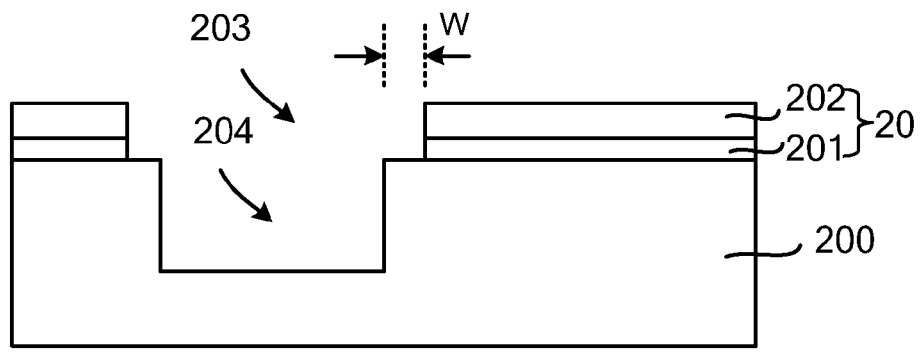

Returning to FIG. 11, after forming the trench 204, a portion of the mask layer 20 may be removed to enlarge the opening 203 (S103). FIG. 5 illustrates a corresponding semiconductor structure.

As shown in FIG. 5, a portion of the hard mask layer 20 around the opening 203 is removed; and the opening 203 is enlarged. The width of the enlarged opening 203 is greater than the width of the trench 204; and a portion of the top surface of the semiconductor substrate 200 may be exposed.

After the width of the opening 203 is enlarged, a portion of the semiconductor substrate 200 at the outer side surface of the trench 204 may be exposed. An epitaxial layer may be subsequently formed in the trench 204. The subsequently formed epitaxial layer may fill up the trench 204 and the opening 203; and subsequently formed the epitaxial layer may also cover the exposed portion of the surface of the semiconductor substrate 200 around the trench 204. Photo-induced carriers generated by a photodiode may be transferred to the floating diffusion region through the subsequently formed epitaxial layer, the portion of the surface of the semiconductor substrate 200 around the trench 204 and the channel region of the transistor.

Referring to FIG. 5, the line distance "W" between the sidewall of the enlarged opening 203 and the sidewall of the trench 204 may limit the width of the transfer channel of the photo-induced carriers. The line distance "W" may be in a range of approximately 0.1 μm~1 μm. In one embodiment, the line distance "W" may be 0.2 μm, 0.5 μm, or 0.7 μm, etc. Such a line distance may ensure the photo-induced carriers to pass through freely.

Various processes may be used to remove the portion of the mask layer 20, such as a dry etching process, a wet etching process, or an ion beam etching process, etc. In one embodiment, the portion of the mask layer 20 is etched by a wet etching process. Specifically, a hot phosphorous acid solution may be used to etch the portion of the hard mask layer 202; and a hydrogen fluoride solution may be used to etch the portion of the interface layer 201.

In certain other embodiments, the portion of the mask layer 20 is etched by a dry etching process. Specifically, the dry etching process may include forming a patterned photoresist layer (not shown) exposing the portion of the hard mask layer 20 on the hard mask layer 20; etching the portion of the hard mask layer 20 using a fluoride-contained etching gas to enlarge the opening 203 in the hard mask layer 20; and stripping off the patterned photoresist layer.

Figure 6:
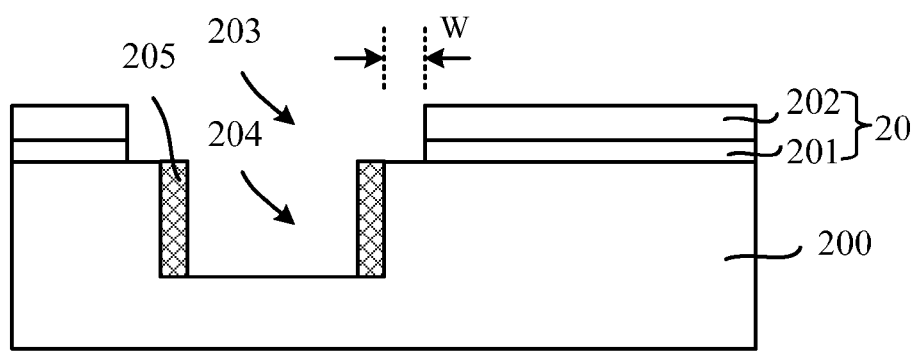

Returning to FIG. 11, after forming the trench 204 and enlarging the opening 203, isolation layers may be formed (S104). FIG. 6 illustrates a corresponding semiconductor structure.

As shown in FIG. 6, isolation layers 205 are formed on the side surfaces of the trench 204. The isolation layers 205 may be configured to electrically isolate the subsequently formed photodiode and the semiconductor substrate 200; and electrically isolate the subsequently formed photodiode and the shallow trench isolation structure. Thus, the isolation layers 205 may prevent the dark current generated in the shallow trench isolation structure region and the semiconductor substrate 200 from being laterally transferred to the photodiode region formed in the trench 204.

The isolation layers 205 may be made of any appropriate material, such as silicon oxide, silicon nitride, or silicon oxynitride, etc. In one embodiment, the isolation l layers 205 are made of silicon oxide. The isolation layers 205 may be a single layer structure, or a multiple-stacked structure.

A process for forming the isolation layers 205 may include forming an isolation material layer on the side and bottom surfaces of the trench 204 and the opening 203, and the top surface of the hard mask layer 20; and followed by a mask-less etching process (an etch back process). The isolation material layer on the top surface of the hard mask layer 20 and the side surface of the opening 203 are removed. Thus, the isolation layers 205 may be formed on the side surfaces of the trench 204.

The thickness of the isolation layers 205 may be in a range of approximately 8 nm-20 nm, such as 10 nm or 15 nm, etc. Such a thickness may ensure the electrical isolation function of the isolation layers 205.

Various processes may be used to form the isolation material layer, such as a CVD process, a PVD process, an ALD process, or an FCVD process, etc. The mask-less etching process may include a dry etching process, a wet etching process, or an ion beam etching process, etc.

Figure 7:
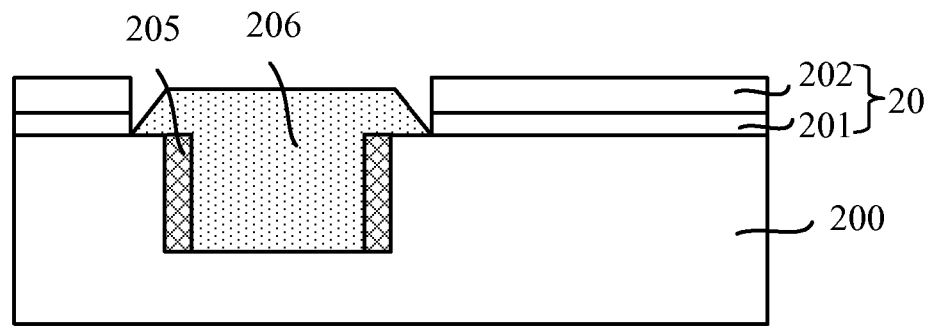

Returning to FIG. 11, after forming the isolation layers 205, an epitaxial layer may be formed in the trench 204 (S105). FIG. 7 illustrates a corresponding semiconductor structure.

As shown in FIG. 7, an epitaxial layer 206 is formed in the trench 204 and the opening 203. The epitaxial layer 206 may cover the isolation layers 205 and the portion of the surface of the semiconductor substrate 200 exposed by the enlarged opening 203; and fill up the trench 204. The epitaxial layer 206 may be doped with the second type doping ions. The doping type of the second type doping ions may be opposite to the doping type of the first type doping ions. The epitaxial layer 206 and the semiconductor substrate 200 on the bottom of the trench 204 may form a PN junction of a photodiode.

The epitaxial layer 206 may be made of any appropriate semiconductor material, such as silicon, or silicon germanium, etc. In one embodiment, the epitaxial layer 206 is made of silicon. For illustrative purposes, a silicon epitaxial layer 206 may used in the description.

The silicon epitaxial layer 206 may be formed by a selective epitaxial growth process. The temperature of the selective epitaxial growth process may be in a range of approximately 600° C.~1100° C. The pressure of the selective epitaxial growth process may be in a range of approximately 1 Torr~500 Torr. The silicon source gas may be $SiH_4$ or dichlorosilane (DSC), etc. The silicon source may also include HCl, or H$_2$, etc. H$_2$ may be used as a carrier gas; and HCl may be used as a selective gas to increase the selectivity of the selective epitaxial process. The flow of the silicon source gas may be in a range of approximately 1 sccm~1000 sccm. The flow of the silicon source gas may be in a range of approximately 1 sccm~1000 sccm. The flow of H$_2$ may be in a range of approximately 0.1 slm~50 slm.

Further, a doping source gas may also be used in the selective epitaxial process to in situ dope the epitaxial layer 206. The doping source gas may have the elements of the second type doping ions. In one embodiment, the pixel structure may be a pixel structure of an N-type CMOS imaging sensor, thus the second type doping ions may include one or more of phosphorous ions, arsenic ions and antimony ions, etc. In certain other embodiments, the pixel structure may be a pixel structure of a P-type CMOS imaging sensor, thus the second type doping ions may include or more of boron ions, gallium ions or indium ions, etc.

In certain other embodiments, the silicon epitaxial layer 206 may be doped with the second type doping ions by an ion implantation process.

Referring to FIG. 7, in one embodiment, the surface of the silicon epitaxial layer 206 may be higher than the top surface of the semiconductor substrate 200, the portion of the silicon epitaxial layer 206 higher than the top surface of the semiconductor substrate 200 may fill the enlarged opening 203; and cover the portion of the top surface of the semiconductor substrate 200 exposed by the enlarged opening 203. The portion of the silicon epitaxial layer 206 contacting with the portion of the tope surface of the semiconductor substrate 200 exposed by the enlarged opening 203 may be configured as a transfer channel of the photo-induced carriers generated by the photodiode.

The width of the portion of the silicon epitaxial layer 206 contacting with the top surface of the semiconductor substrate 200 may be in a range of approximately 0.1 μm~1 μm, such as 0.2 μm, 0.5 μm, or 0.7 μm, etc., such a width may ensure the photo-induced carriers to pass through freely.

Referring to FIG. 7, possible dark currents generated between the side surfaces of the epitaxial layer 206 and the semiconductor substrate 200 may be isolated by the isolation layers 205, thus the image quality of the pixel structure may be improved.

Figure 8:
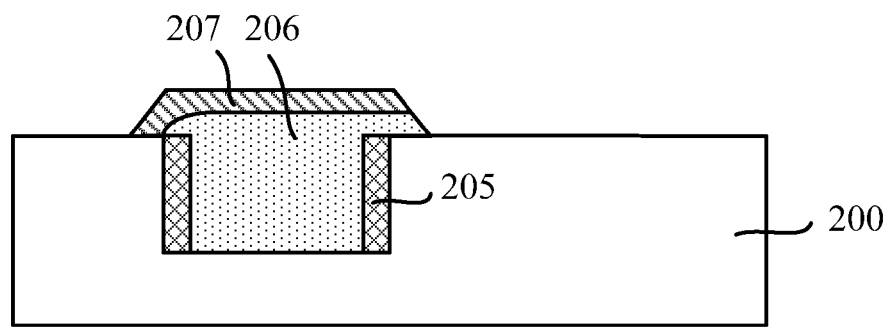

Returning to FIG. 11, after forming the epitaxial layer 206, a pinning layer may be formed (S106). FIG. 8 illustrates a corresponding semiconductor structure.

As shown in FIG. 8, a pinning layer 207 is formed on the surface of the epitaxial layer 206. The pinning layer 207 may prevent a dark current from being generated on the surface of the silicon epitaxial layer 206. Further, the pinning layer the pinning layer 207 may form a PN junction; and the pinning layer 207 may be portion of the photodiode.

Various processes may be used to form the pinning layer 207. In one embodiment, the pinning layer 207 is formed by performing an ion implantation process onto the surface of the silicon epitaxial layer 206. The doping type of the pinning layer 207 may be opposite to the doping type of the second type doping ions. In one embodiment, the pinning layer 207 is P-type doped. Before performing the ion implantation process, a mask layer may be formed on a portion of the silicon epitaxial layer 206 at one side of a subsequently formed gate structure.

In certain other embodiments, the pinning layer 207 may be formed by depositing a doped semiconductor layer on the surface of the silicon epitaxial layer 206 by any appropriate process.

The thickness of the pinning layer 207 may be smaller than the height of the portion of the silicon epitaxial layer 206 above the surface of the semiconductor substrate 200. Such a thickness may cause the portion of the silicon epitaxial layer 206 contacting with surface of the semiconductor substrate to be a transfer channel of the photo-induced carriers.

Returning to FIG. 11, after forming the pinning layer 207, a gate structure may be formed (S107). FIG. 9 illustrates a corresponding semiconductor structure.

As shown in FIG. 9, a gate structure 210 is formed on the surface of semiconductor substrate 200 at one side of the silicon epitaxial layer 206. The gate structure 210 may be a portion of a transfer transistor.

The gate structure 210 may be configured to control the channel region under the bottom of the gate structure 210. When the channel region is turned on by the gate structure 210, the photo-induced carriers generated in the silicon epitaxial layer 206 may be transferred to a floating diffusion region subsequently formed in the semiconductor structure 200 at the other side of the gate structure 210 through the channel region.

As shown in FIG. 9, the gate structure 210 may include a gate dielectric layer 209 formed on the surface of the semiconductor substrate 200, a gate electrode layer 208 formed on the gate dielectric layer 209, and a sidewall spacer (not labeled) formed around the gate electrode layer 208 and the gate dielectric layer 209.

The gate dielectric layer 209 may be made of any appropriate material, such as silicon oxide, silicon nitride, or silicon oxynitride, etc. In one embodiment, the gate dielectric layer 209 is made of silicon oxide.

The gate electrode layer 208 may be made of any appropriate material, such as poly silicon, or other appropriate conductive material. In one embodiment, the gate electrode layer 208 is made of poly silicon.

Further, as shown in FIG. 9, the gate structure 210 may be near to the portion of the silicon epitaxial layer 206 on the surface of the semiconductor substrate 200, the sidewall spacer may be configured as an isolation layer between the gate structure 210 and the silicon epitaxial layer 206. The sidewall spacer may be a single layer structure, or a multiple-stacked structure. In one embodiment, the sidewall spacer may be a single layer structure made silicon nitride. In certain other embodiments, the sidewall spacer may be three-layer structure, such as silicon oxide-silicon nitride-silicon oxide. Other appropriate material, such as silicon oxynitride, or silicon carbonitride, etc., may also be used to form the sidewall spacer. The gate structure 210 may be formed by any appropriate process.

Further, select transistors, amplify transistors, reset transistors and other gate structures may also be formed on and/or in the semiconductor substrate 200. In certain other embodiments, the gate structures 210 may be formed before forming the trench 204 and the epitaxial layer 206.

Returning to FIG. 11, after forming the gate structure 210, a floating diffusion region may be formed (S108). FIG. 10 illustrates a corresponding semiconductor structure.

As shown in FIG. 10, a floating diffusion region 211 is formed in the semiconductor substrate 200 at one side of the gate structure 210 far from the silicon epitaxial layer 206. That is, the silicon epitaxial layer 206 is at one side of the gate structure 210; and the floating diffusion region 211 is at the other side of the gate structure 211. Various processes may be used to form the floating diffusion region 211. In one embodiment, the floating diffusion region 211 may be formed by an ion implantation process. The doping type of the floating diffusion region 211 may be same as the doping type of the second doping ions of the epitaxial layer 206. In one embodiment, the floating doping region 211 is doped with N-type ions.

Thus, a pixel structure of a CMOS imaging sensor may be formed by the above disclosed processes and methods; and a corresponding pixel structure is illustrated in FIG. 10. The pixel structure includes a substrate 200; and a gate structure 210 formed on the surface of the substrate 200. The pixel structure also includes an epitaxial layer 206 formed in the semiconductor substrate 200 at one side of the gate structure 210, and isolation layers 205 formed between the side surfaces of the epitaxial layer 206 and the semiconductor substrate 200. Further, the pixel structure includes a pinning layer 207 formed on the surface of the epitaxial layer 206, and a floating diffusion region 211 formed in the semiconductor substrate 200 at the other side of the gate structure 210. The detailed structures and intermediate structures are described above with respect to the fabrication processes.

By using the disclosed structures and methods, photositive regions of photodiodes may be isolated from the semiconductor substrate and the shallow trench isolation structures by isolation layers, thus the dark currents generated in the shallow trench isolation structures and the semiconductor substrate may be unable to transfer to the photodiode regions laterally. Therefore, imaging quality of the pixel structure may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a pixel structure of a CMOS imaging sensor, comprising:
   providing a semiconductor substrate doped with first type doping ions;
   forming a hard mask layer having an opening on the semiconductor substrate;
   forming a trench in the semiconductor substrate by etching the semiconductor substrate using the hard mask layer as an etching mask;
   etching the hard mask layer to enlarge the opening to form an enlarged opening to expose a surface portion of a top surface of the semiconductor substrate around the trench;
   forming isolation layers on side surfaces of the trench to prevent a dark current from laterally transferring;
   forming an epitaxial layer doped with second type doping ions with a doping type opposite to a doping type of the first type doping ions in the trench by filling up the trench and covering the surface portion of the top surface of the semiconductor substrate around the trench,
   wherein a portion of the epitaxial layer is higher than the top surface of the semiconductor substrate, the portion of the epitaxial layer higher than the top surface of the semiconductor substrate is filled in the enlarged opening, and the portion of the epitaxial layer higher than the top surface of the semiconductor substrate covers the surface portion of the top surface of the semiconductor substrate exposed by the enlarged opening;
   forming a pinning layer on the epitaxial layer;
   forming a gate structure on the top surface of the semiconductor substrate at one side of the epitaxial layer; and
   forming a floating diffusion region in the semiconductor substrate at one side of the gate structure far from the epitaxial layer.

2. The method according claim 1, wherein:
   a photodiode is formed by the epitaxial layer and the semiconductor substrate.

3. The method according to claim 1, wherein:
   the epitaxial layer is made of silicon.

4. The method according to claim 1, wherein:
   a line distance between a side surface of the enlarged opening and a side surface of the trench is in a range of approximately 0.1 µm~1 µm.

5. The method according to claim 1, wherein forming the isolation layer further includes:
   forming an isolation material layer on side surfaces of the trench; and
   performing a mask-less etching process onto the isolation material layer.

6. The method according to claim 1, wherein:
   a thickness of the isolation layers is in a range of approximately 8 nm~20 nm.

7. The method according to claim 1, wherein:
   the epitaxial layer is formed by a selective epitaxial process with an in situ doping.

8. The method according to claim 2, wherein:
   the first type doping ions are P-type; and
   the second type doping ions are N-type.

9. The method according to claim 2, wherein:
   the first type doping ions are N-type; and
   the second type doping ions are P-type.

10. The method according to claim 1, wherein:
    the pinning layer is formed by an ion implantation process; and
    a doping type of the pinning layer is same as the doping type of the semiconductor substrate.

* * * * *